(12) United States Patent
Hirschmann

(10) Patent No.: US 7,164,278 B2
(45) Date of Patent: Jan. 16, 2007

(54) DEVICE FOR RELEASABLE CONNECTING AN INTERFACE WITH A TEST EQUIPMENT

(75) Inventor: Peter Hirschmann, Herrenberg (DE)

(73) Assignee: Agilent Technologies, Inc., Palo Alto, CA (US)

( * ) Notice: Subject to any disclaimer, the term of this patent is extended or adjusted under 35 U.S.C. 154(b) by 119 days.

(21) Appl. No.: 11/096,377

(22) Filed: Apr. 1, 2005

(65) Prior Publication Data
US 2005/0264278 A1    Dec. 1, 2005

(30) Foreign Application Priority Data
Apr. 5, 2004    (GB) ................ 04101408.5

(51) Int. Cl.
*G01R 31/02*    (2006.01)
(52) U.S. Cl. .................................... 324/754
(58) Field of Classification Search ........... 439/482; 324/754, 758
See application file for complete search history.

(56) References Cited

U.S. PATENT DOCUMENTS

| | | | |
|---|---|---|---|
| 5,068,601 A | 11/1991 | Parmenter | 324/754 |
| 5,453,995 A | 9/1995 | Behrens | 371/27 |
| 5,499,248 A | 3/1996 | Behrens et al. | 371/22.1 |
| 5,923,180 A | 7/1999 | Botka et al. | 324/758 |
| 6,166,553 A | 12/2000 | Sinsheimer | 324/754 |
| 6,624,646 B1 * | 9/2003 | Zaiser | 324/754 |
| 6,747,447 B1 | 6/2004 | Markert et al. | 324/158.1 |

FOREIGN PATENT DOCUMENTS

EP    0 999 450 A1    10/2000

* cited by examiner

*Primary Examiner*—Neil Abrams
(74) *Attorney, Agent, or Firm*—Ohlandt, Greeley, Ruggiero & Perle, L.L.P.

(57) ABSTRACT

Disclosed is a device for releasable connecting an interface with a load board for providing a mechanically pressing of the components against each other. The device comprises a toroidal lock, which is operated by at least one lever to transmit the lock from a releasing position to a locking position. This device enables a quick change of Load boards to the interface with a reproducible positioning. The load board may include extensions, such as rollers, that enter slot-like guides in the toroidal lock and that are to be retained in these guides when the lock is rotated to a locking position.

10 Claims, 5 Drawing Sheets

DEVICE FOR RELEASABLE CONNECTING AN INTERFACE WITH A TEST EQUIPMENT

BACKGROUND OF THE INVENTION

The present invention relates to a device for releasable connecting an interface with test equipments.

Testers such as IC testers are provided for generating dedicated analog and/or digital signals to a device under test (DUT) and analyzing the response thereof. Such testers are described in detail e.g. in the co-pending European patent application No. 99105625.0 by the same applicant, EP-A-88299, U.S. Pat. No. 5,499,248 or U.S. Pat. No. 5,453,995.

In most cases, the provision of signals from the tester to a specific application site of the DUT has to be matched with the specific mechanical and electrical properties of the tester as well as of an application equipment handling the DUT.

FIG. 1 shows an example of a typical DUT application equipment such as a wafer prober 10 for transporting and positioning highly sensitive silicon wafers as DUTs. The wafers (not visible inside the wafer prober 10) are internally connected to a probe card 20 as interface of the wafer prober 10 towards a tester 25 (in FIG. 1 only symbolized as a general block). Wafer probers are generally applied for testing integrated circuit in the earliest possible production phase.

The probe card 20 is typically a device-specific printed circuit board (PCB), e.g. with high-density contact needles on the wafer side and gold-plated contact pads on the tester side (as the side visible in FIG. 1). The probe card 20 normally straddles the dense (needle) pattern from the wafer side to a wider pad pattern for contacting the tester 25. The size of the probe card 20 is generally limited by the hardware of the wafer prober 10. The wafer prober 10 has to ensure a reliable electrical contact between the contact pads of the wafer and the probe card 20.

A load board 30 represents the electrical and mechanical interface of the tester 25 towards the DUT. The Load board 30 normally is a device specific printed circuit board (PCB) custom-built for the specific requirements of the DUT application equipment and can be exchanged dependent on the respective application. More details about the load boards 30 are described in particular in the aforementioned copending European patent application No. 99105625.0. In case that the load board 30 is provided as a custom-built exchangeable part, the load board 30 is often contacted within the tester 25 by means of spring-loaded contact pins (also called "Pogo™").

While the load board 30 and the probe card 20 are electrically optimized (e.g. with respect to signal speed, signal purity, impedance, and transmission rate) regarding either the tester 25 or the DUT of the wafer prober 10, a good electrical and mechanical matching between the load board 30 and the probe card 20 has to be achieved. This becomes in particular important with increasing signal transmission rates going up to two Gigabit per second.

In the example of FIG. 1, an interface tower 50 (also called "Pogo™ tower") is used as interface between the load board 30 and the probe card 20. The interface tower 50 converts the pin pattern (normally rectangular arrangement) of the load board 30 of the tester to the pattern (normally round and more dense) of the probe card 20. In the example of FIG. 1, the interface tower 50 further has to bring signals from the tester 25 through a round-shaped hole in a head plate of the wafer prober 10 and bridge the spatial distance between the load board 30 and the probe card 20.

All the interfacing provided by the interface tower 50 has to be done with a minimum loss in performance for the entire test system provided by the tester 25 and the application equipment of the wafer prober 10. That means, that all parts in the electrical path of the interface tower 50 have to maintain a controlled impedance (normally 50 Ω) and a high contact quality for each provided tester channel (e.g. more than 1.000 channels).

The interface tower 50 comprises rods for adjusting and fixing the interface tower 50 to different load boards 30. The load boards 30 are fixed by screw connections.

To ensure the high contact quality it is requested, that the mechanical and electrical contact between the interface tower and the load board is after each change of load board of the same condition. Therefore all screw connections have to be tighten up properly to achieve the required mechanical and electrical contact between the interface tower and the Load board. A visual control is not possible given. The screw connections are furthermore very time consuming for changing load boards.

SUMMARY OF THE INVENTION

It is therefore an object of the present invention to provide a device for easily and reproducible connecting an interface with a test equipment. The object is solved by the independent claim. Preferred embodiments are shown by the dependent claims.

According to the invention, a device for releasable connecting is provided with a ring-shaped or toroidal lock. After the load board is positioned to the interface they will be fixed against one another by a movement of the lock and the electrical contact between the interface and the load board is achieved.

At least one lever is provided for locking and releasing the toroidal lock. The lever is rotatable about an axis, which is perpendicular to the rotation axis of the lock. This allows to turn the lever towards the load board.

Preferably, the turning direction of the lever is in the endphase nearly identical to the movement direction of the load board for positioning them to the interface. The axis of the lever is directed parallel to a frame of the load board when situated a locking position to the interface or is positioned perpendicular to the axis of the lock.

In a preferred embodiment the toroidal lock is located in a support of the interface. This allows to reduce the weight of the load board which will be changed to the interface and the cost for this system. This embodiment further comprises that several bearing rollers are provided for positioning the lock rotatable to the support and for an exact axial guidance to the interface. This enables an exact positioning of the contacts located at the load board to those of the interface.

Preferably two levers are located preferably stationary with their rotation axis to the interface opposite to one another for an easy handling and to reduce the handling force for locking the toroidal lock. During the locking procedure the mechanically pressing will be increased to ensure finally in the locking position the electrical contact between the components.

In a further preferred embodiment the lock comprises at least one first guide for receiving at least one bearing attached to the load board and further comprises at least one second guide for securing the lock by at least one bearing to the interface. After positioning the test equipment to the interface the lock engages at the same time with the at least one bearing of the interface and with the at least one bearing of the load board. Therefore, only one rotatable movement of the lock with a preferably small amount of a traverse path enables the locking and releasing.

In a preferred embodiment the at least one bearing of the interface and the at least one bearing of the load board are located in the same plane crossing the longitudinal axis of the toroidal lock. Therefore, the forces for the mechanically pressing of the interface and the load board against each other will be initiated without producing any additional rotatable forces or shear stresses.

In a further preferred embodiment the first guide for receiving the bearing of the load board provided in the lock has a first section with a pitch directed to ensure an easily engagement of the load board bearing into the first guide. Further it is provided upstream to the first pitch at least one second section of the guide to rest the bearing in a locking position and to ensure the electromagnetic link between the interface and the load board.

In a preferred embodiment, the rotatable movement of the lock for locking is limited by the length of second section or an abutment and therefore after changing the load board always the same conditions of the mechanically pressing of the components against each other will be achieved. The bearing of the load board rest in a locking position of the second section of the guide. Therefore, a reliable electrical contact is ensured.

For transmitting the radial movement of the lock initiated by the lever there is according to a further preferred embodiment provided a hinge bearing. This hinge bearing is positioned in a radial formed slot of the lock. This hinge bearing comprises a shaft for receiving a bearing roller. On a spherical surface of the bearing roller is free rotatable and also free in his angular position to the shaft located in a ring to compensate the transversal movement of the lever, which is tangential to the lock 111, with respect to the radial movement of the bearing roller carried on the shaft.

In a further preferred embodiment the lever comprising a mouth for receiving the hinge bearing is provided with a U-shaped guide for securely engaging with the ring of the hinge bearing. This allows an easy and secure handling for locking and releasing the device.

The above mentioned bearings are for example slide bearings or bearing rollers.

The assembly according to the invention is formed as a quick-release fastener and enable a quick change and a reproducible positioning of the load boards to the interface. Alternatively it is also in the scope of the invention, that the lock is provided in a support of the Load board and the further components are arranged correspondingly.

BRIEF DESCRIPTION OF THE DRAWING

The object and many of the attendant advantages of the present invention will be readily appreciated and become better understood by reference to the following detailed description when considering in connection with the accompanied drawings.

Features that are substantially or functionally equal or similar will be referred to with the same reference sign(s).

DETAILED DESCRIPTION OF THE INVENTION

Figure 1:
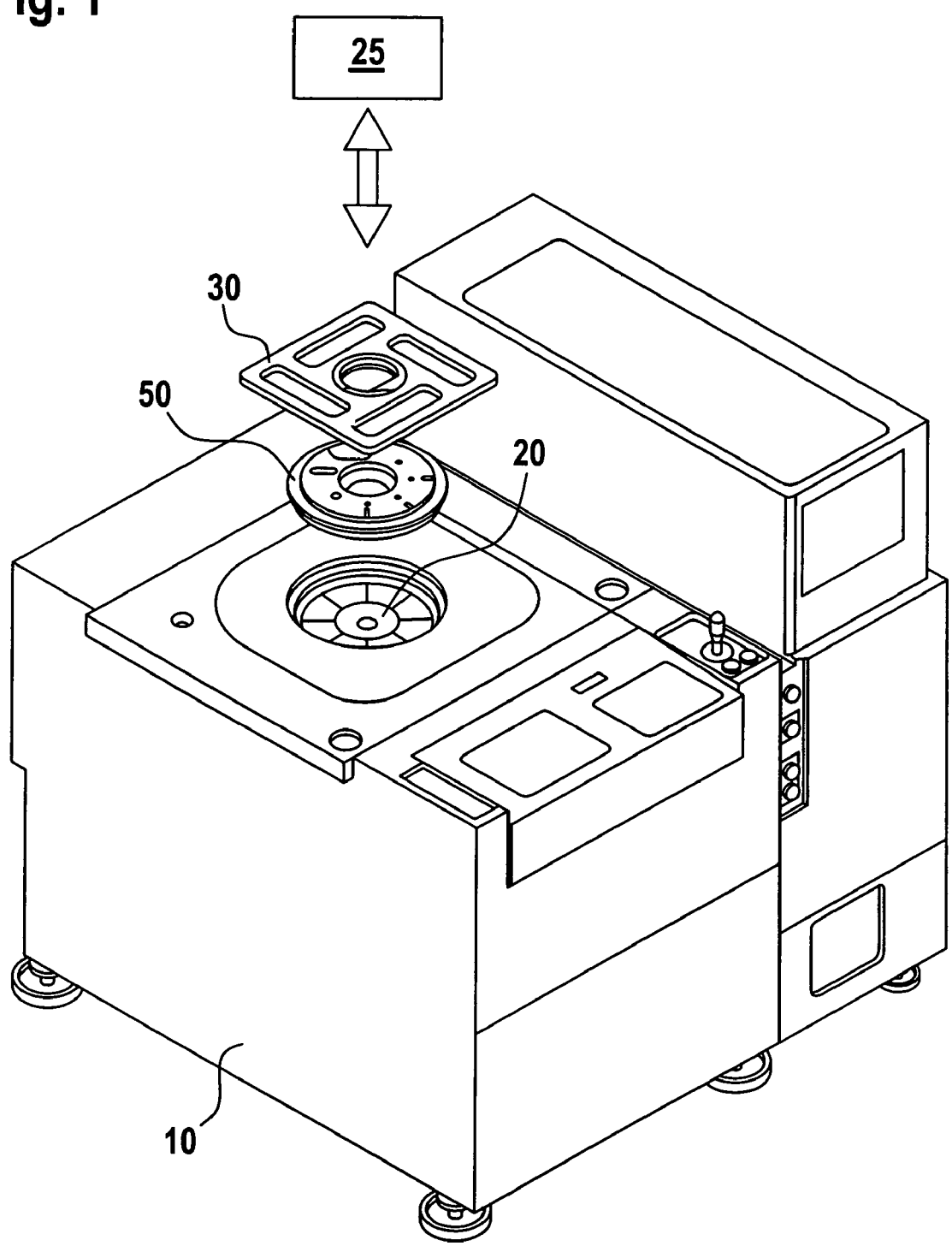
FIG. 1 shows an example of an typical DUT application equipment.
Figure 2:
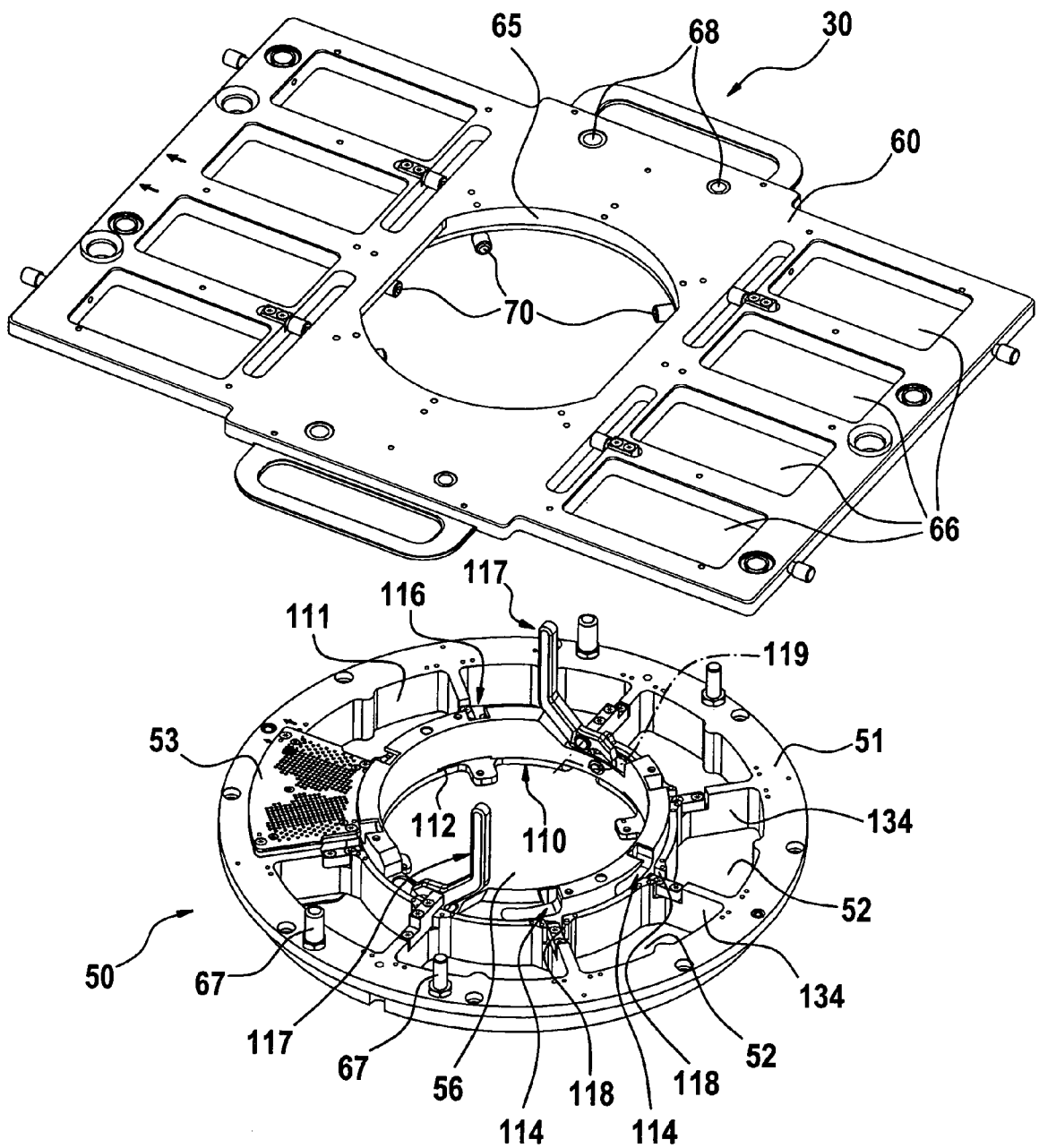
FIG. 2 shows a perspective view of an interface and a Load board.

FIG. 2 shows a perspective view in detail of the interface 50 and a test equipment 30 such as a load board or a DUT board, which will be lowered to the interface 50 for connecting each other. The load board 30 comprises a frame 60 with a central opening 65. Apart to the central opening 65 are provided several openings 66 for receiving the contact pads. Next to the central opening 65 are provided bearing rollers 70 on the underside of the frame 60.

The interface 50 comprises a frame 51 with a plurality of recesses 52 for receiving the segment 53. Those segments are adapted to receive double-sighted spring-loaded contacts 55 ("Pogo™") to provide an transmission of an electrical signal between the load board 30 and the probe card 20. The interface 50 also comprises a central opening 56 which corresponds to the opening 66 of the load board 30. Adjacent to the central opening 56 a device 110 according to the invention for releasable connecting the load board 30 to the interface 50 is provided. This device 110 comprises at least a toroidal lock 111, which is positioned in a support 112 surrounding the central opening 56. The lock 111 comprises first guides 114 for receiving the bearing 70 of the load board 30, when the load board 30 is positioned to the interface 50 according the cross sectional view in FIG. 3a. The lock 111 is provided according to FIG. 2 in a receiving position 116. This receiving 116 position is given, if levers 117 of the lock 111 are in an upright position. This means, that entrances 118 of the first guides 114 are exactly in the angular position, in which the bearing 70 are attached to the load board 30. For an easily positioning of the load board 30 to the interface 50 there are provided at least one guide rod 67 on the interface 50 and at least one inlet-funnel 68 which engage to one another before the bearing 70 are located to the first guide 114.

Figure 3A:
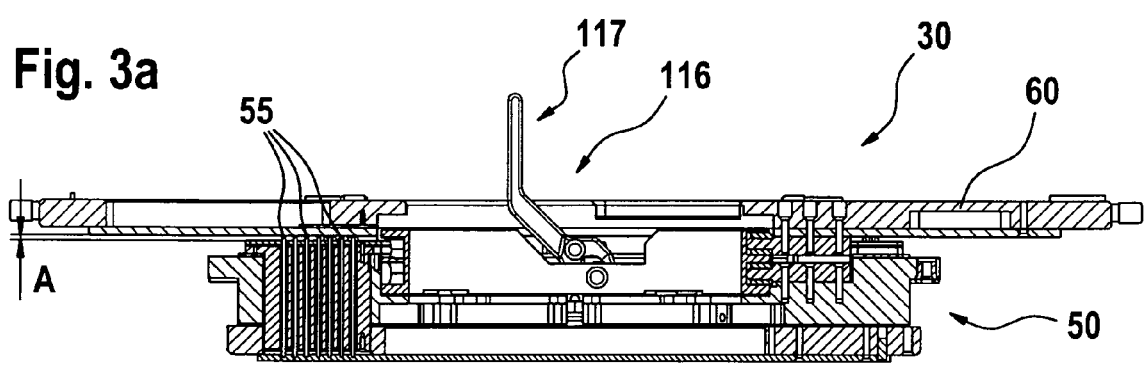
FIGS. 3a/b show a cross sectional view of the interface and the load board in a releasing and locking position.
Figure 3B:
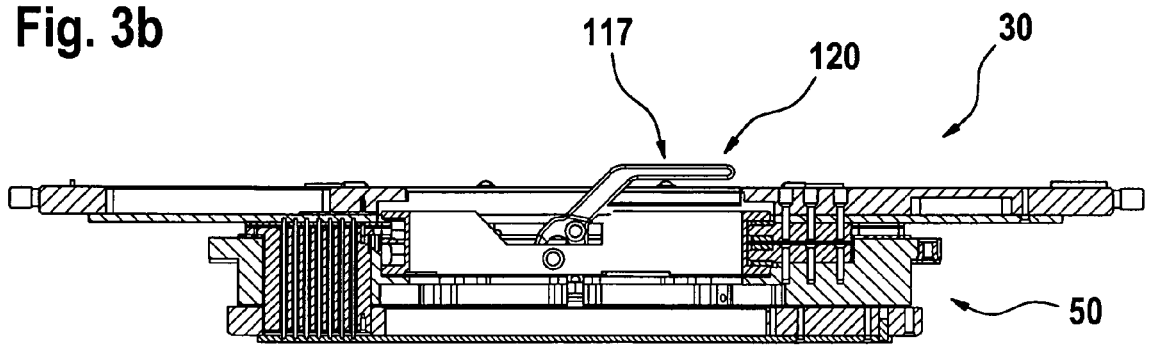

FIG. 3a shows an intermediate or a receiving position 116 of the load board 30 to the interface 50 in a cross sectioned view. In this position the locking procedure can be started. The lever 117 will be operated by turning about an axis 119 which is perpendicular to the rotation axis of the lock 111. The handle of the lever 117 will be parallel located to the surface of the load board 30 in a locking position 120 according to FIG. 3b. During the locking procedure the load board 30 will be pressed against the double-sighted spring-loaded contacts 55 to eliminate the distance A. A press load for example of at least 3.000 Newton has to be introduced by the lever 117 to move the load board 30 against the spring loaded contacts 55 for the electrical contact.

Figure 4:
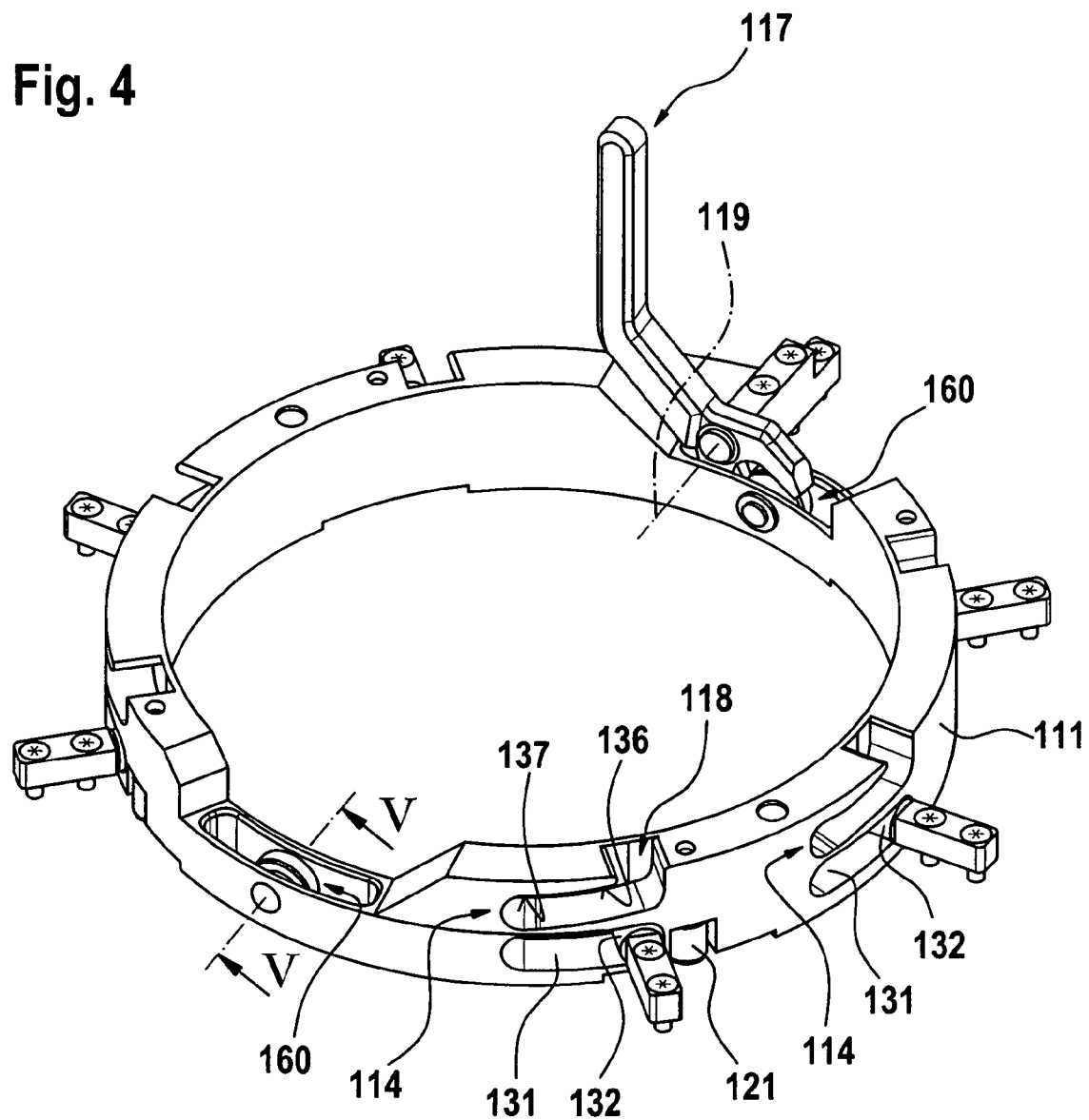
FIG. 4 shows a perspective view on a toroidal lock.

In FIG. 4 is shown a perspective view of the lock 111. For the radial guidance of the lock 111 are provided bearings 121, which are supported on the circumferential wall of the support 112. Very close to the bearings 121 are positioned first guides 114 and also second guides 131 which have preferable the same length as the first one. The second guide 131 is provided to secure the lock 111 to the interface 50 with a bearing 132. The entrance 118 of the first guide 114 is positioned for receiving the load board 30 in the same plane as the bearing 132 is positioned. This has the advantage, that by introducing the radial movement of the lock 111 by the lever 117 the tension force onto the bearings 70 of the load board 30 and those of the bearings 132 are in the same plane and do not cause share stresses or any torque.

The bearings 132 are preferably positioned in equal distance to each other around the lock 111. Preferably they are attached to wall sections 134 between the recesses 52 of the frame 51. Therefore the transmission of force can be uniform over the diameter of the lock 111.

The first guide 114 comprises a first section 136 with a pitch which can be followed by an at least second section with a higher pitch than the first. At least one further section 137 is provided, which pitch is opposite to the pitch of the first section 136 to ensure a save positioning of the lever 117 in a locking position. Due to the different pitches of the sections 136, 137 an easy handling and a reproducible position, pressure and a self holding locking is achieved. This allows an ergonomic handling.

Figure 5:
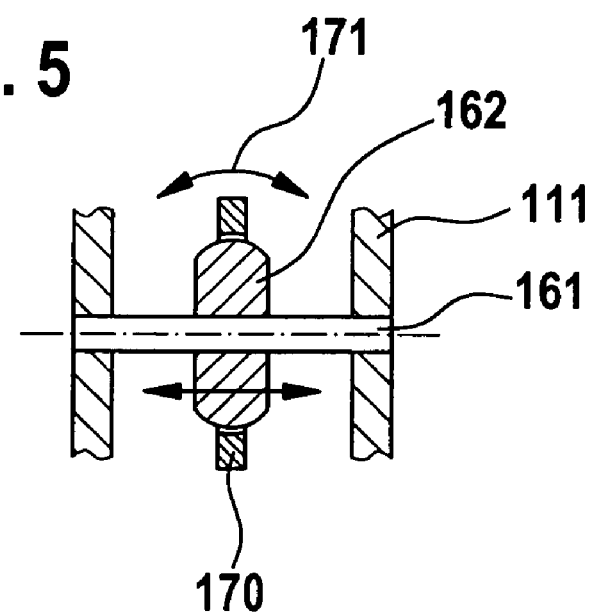
FIG. 5 shows a cross sectional view of a hinge bearing and FIG. 6 shows a perspective view of a lever.

For transmitting the movement of the lever 117, which is tangential with respect to the lock, to the radial movement of the lock 111 there is provided an hinge bearing 160, which is shown in detail in FIG. 5. The hinge bearing 160 comprises a shaft 161 carrying a bearing roller 162, which is free rotatable and moveable along the axis of the shaft 61. On a spherical surface of the roller 162 is positioned an outer ring 170. This ring 170 is also rotatable on the roller 162 and angular moveable according the arrow 171. This allows the transmission of a transversal movement especially for the movement tangential to the lock 111 into a radial movement of the lock 111.

Figure 6:
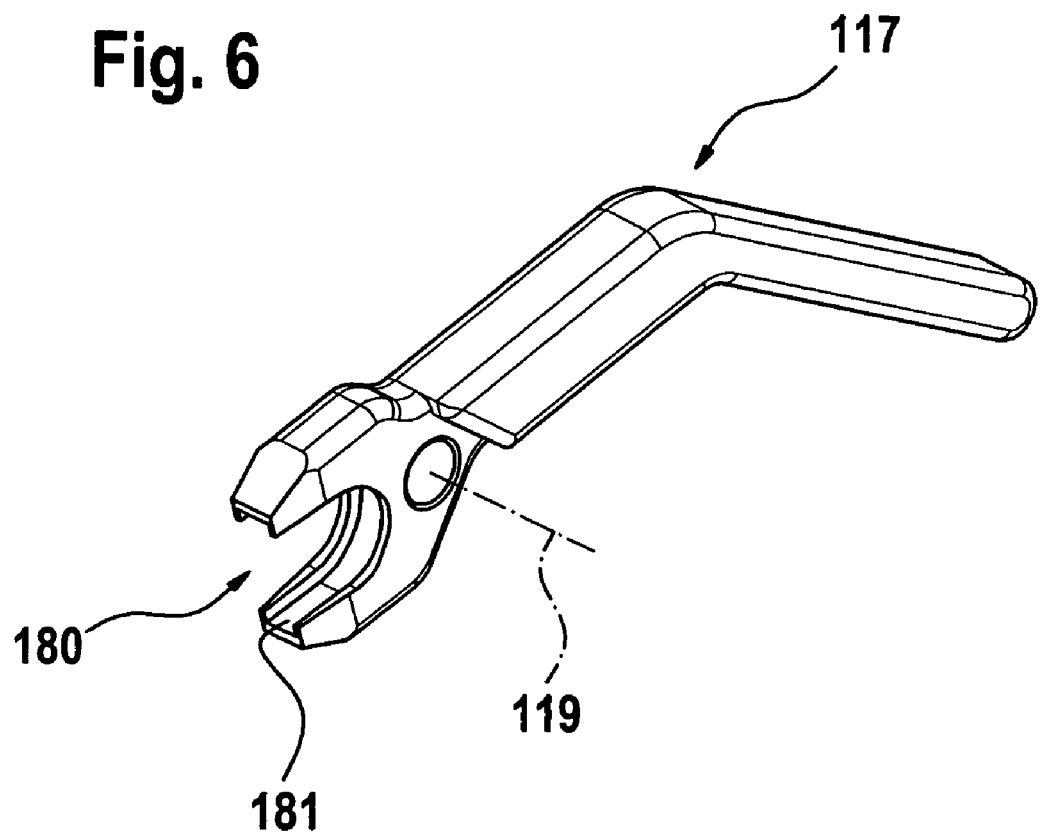

The lever 117 shown in more detail according to FIG. 6 comprises a mouth 180 with a recess 181 for receiving and guiding the ring 170. Therefore securely the initiated force on the handle of the lever 117 is secure transmitted into a rotatable movement of the lock 111 for transferring the lock 111 from a receiving position 116 into a locking position. In the locking position of the lock 111, the load board rollers 70 will be held in the guides 114 of the lock and load board circuitry will be pressed against contacts 55 of the interface 50.

The invention claimed is:

1. A device for releasable connecting an interface with a test equipment, comprising:
    a toroidal lock for locking and releasing test equipments to the interface,
    at least one bearing for radial guidance and a rotatable movement of the lock within a support of the interface, and
    at least one lever for locking and releasing the toroidal lock,
   wherein
    the rotation axis of the lever is positioned perpendicular to the rotation axis of the lock.

2. The device of claim 1, wherein the toroidal lock comprises at least one first guide for receiving at least one bearing, which is attached to the test equipment and at least one second guide for securing the lock free rotatable by at least one bearing to the interface.

3. The device of claim 2, wherein the bearing of the interface and the bearing of the test equipment are located in the same plane crossing the longitudinal axis of the toroidal lock.

4. The device of claim 1, wherein the first guide for receiving the bearing of the test equipment comprises a first section with a first pitch reducing the distance wherein between the interface and the test equipment and at least one second section with a pitch of opposite direction to the first one for locking.

5. The device of claim 4, wherein the second section of the first guide has a limited length or corresponds with an abutment.

6. The device of claim 1, wherein the toroidal lock comprises at least one hinge bearing for transmitting the rotation of the lever into a rotation of the lock.

7. The device of claim 6, wherein the hinge bearing comprises a shaft carrying a bearing roller free rotatable and moveable along the axis of the shaft and further comprises a ring, which is free rotatable positioned on a spherical surface of the bearing roller.

8. The device of claim 7, wherein the lever comprises a mouth with a U-shaped recess for engaging with the ring of the hinge bearing.

9. The device of claim 1, wherein the bearings are at least of: a slide bearing and a bearing roller.

10. The device of claim 1, wherein the toroidal lock and at least one lever are a quick-released fastener.

* * * * *